United States Patent
Botti et al.

(10) Patent No.: US 10,104,483 B2
(45) Date of Patent: Oct. 16, 2018

(54) CIRCUIT AND METHOD FOR DETECTING THE LOAD STATUS OF AN AUDIO AMPLIFIER

(71) Applicant: STMicroelectronics S.r.l., Agrate Brianza (IT)

(72) Inventors: Edoardo Botti, Vigevano (IT); Marco Raimondi, Busto Garolfo (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 159 days.

(21) Appl. No.: 15/216,579

(22) Filed: Jul. 21, 2016

(65) Prior Publication Data

US 2017/0150281 A1 May 25, 2017

(30) Foreign Application Priority Data

Nov. 24, 2015 (IT) .......................... 102015000076009

(51) Int. Cl.
*H04R 29/00* (2006.01)

(52) U.S. Cl.
CPC .................................... *H04R 29/00* (2013.01)

(58) Field of Classification Search
CPC .... H04R 29/00; H04R 29/001; H04R 29/004; H04R 27/00; H04R 3/12; H04R 3/04; H04S 7/301
USPC ..................................................... 381/58, 59
See application file for complete search history.

(56) References Cited

U.S. PATENT DOCUMENTS

| | | | | |
|---|---|---|---|---|
| 4,216,517 A | * | 8/1980 | Takahashi | H03F 1/52 330/207 P |
| 4,962,350 A | * | 10/1990 | Fukuda | H02H 3/04 323/283 |
| 2002/0093340 A1 | | 7/2002 | Chiozzi et al. | |
| 2006/0103467 A1 | * | 5/2006 | Schoenberger | H03F 1/52 330/298 |
| 2009/0051368 A1 | | 2/2009 | Knott | |
| 2013/0070932 A1 | * | 3/2013 | Nyu | H04R 3/007 381/58 |
| 2015/0078560 A1 | | 3/2015 | Ilango et al. | |

* cited by examiner

*Primary Examiner* — Matthew Eason
*Assistant Examiner* — Sabrina Diaz
(74) *Attorney, Agent, or Firm* — Slater Matsil, LLP (57) ABSTRACT

A diagnostic circuit is used for detecting the load status of an audio amplifier. The audio amplifier includes two output terminals for connection to a speaker. The diagnostic circuit may include a first circuit, which configured to generate a first signal indicating whether a signal provided via the two output terminals comprises an audio signal. A second circuit can be configured to detect a first measurement signal being indicative for the output current provided via the two output terminals, and to compare the first measurement signal with at least one threshold in order to generate a second signal indicating whether the output current has a low current amplitude profile or a high current amplitude profile. A third circuit can be configured to generate a diagnostic signal as a function of the first and the second signal.

22 Claims, 8 Drawing Sheets

CIRCUIT AND METHOD FOR DETECTING THE LOAD STATUS OF AN AUDIO AMPLIFIER

This application claims priority to Italian Patent Application No. 102015000076009, filed on Nov. 24, 2015, which application is hereby incorporated herein by reference.

TECHNICAL FIELD

Embodiments of the present disclosure relate to techniques for determining the load status in an audio system.

BACKGROUND

Figure 1:
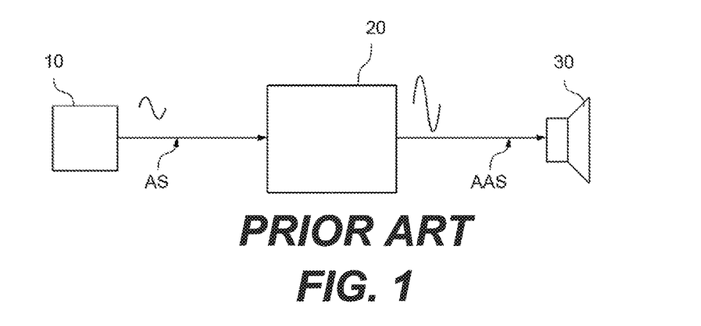
FIG. 1 shows a typical audio system.

FIG. 1 shows a typical audio system. In the example considered, the system comprises an audio signal generator 10, such as a radio, CD or MP3 player, generating an analog audio signal AS to be sent to at least one speaker 30.

In the example considered, an audio amplifier 20 is interposed between the audio signal generator 10 and the speaker 30, which is configured to generate an amplified audio signal AAS by amplifying the analog audio signal AS provided by the audio signal generator 10.

Figure 2:
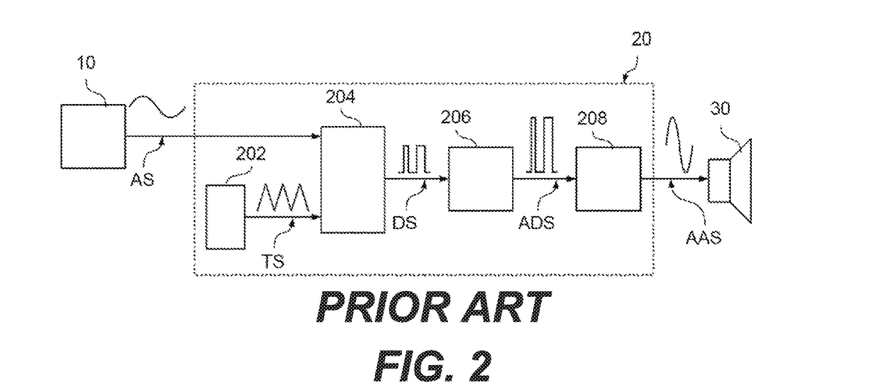
FIG. 2 shows a possible implementation of a so called class D audio amplifier.

For example, FIG. 2 shows a possible implementation of a so called class D audio amplifier 20.

Specifically, in the example considered, the audio amplifier 20 comprises a waveform generator 202 generating a periodic triangular waveform signal TS, having typically a frequency between 250 kHz and 2.5 MHz. The triangular waveform signal TS is sent together with the audio signal AS to a comparator 204, which compares the audio signal AS with the triangular waveform signal TS thereby generating a square wave signal DS, whose duty-cycle varies as a function of the amplitude of the audio signal AS.

The square wave signal DS is then amplified by an amplifier stage 206, usually comprising two electronic switches, thereby generating an amplified square wave signal ADS. Finally, the amplified square wave signal ADS is sent to a low-pass or bandpass filter 208, which removes at least the high-frequency spectrum from the signal amplified square wave signal ADS, thereby generating the amplified audio signal AAS which is proportional to the original audio signal AS. The operation of such a class D amplifier is well known to those skilled in the art, rendering a more detailed description herein superfluous.

Substantially, the class D amplifier is based on the fact that the switching frequency of the amplifier 20 is significantly higher than the usual audio band (between 20 Hz and 20 kHz) and accordingly the high switching frequency may be filtered with the filter stage 208, thereby reconstructing the profile of the original audio signal AS.

In the context of digital audio data, the signal generator 10 may comprise an analog-to-digital converter for generating the signal AS or the signal generator 10 may provide directly the digital signal DS.

In any case, substantially similar low-pass or bandpass filters 208 are provided in most audio amplifier circuits and/or may be integrated also within the speaker 30.

Figure 3:
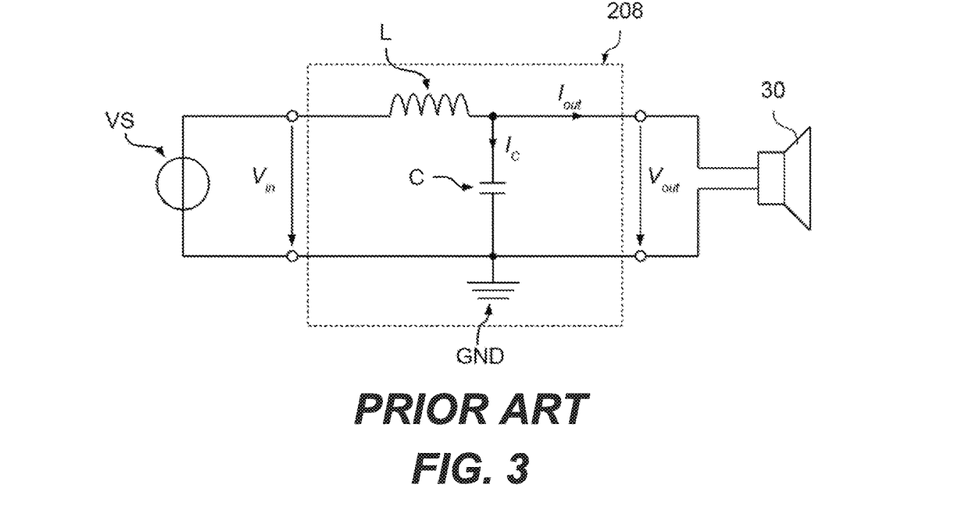
FIG. 3 shows how an audio system may be modelled.

Accordingly, generally, an audio system may be modelled as shown in FIG. 3.

In the example considered, the system comprises a generic signal generator, such as a voltage source VS, a filter stage 208 configured to filter the signal provided by the signal generator, and a speaker 30 which reproduces the signal provided by the filter stage 208. Accordingly, in general, the filter stage 208 comprises two input terminals for receiving the signal provided by the signal generator $V_S$ and two output terminals for providing the filtered signal $V_{out}$.

For example, in the example considered, the filter 208 is a LC filter. Specifically, in the example considered, the first input terminal is connected to the first output terminal via an inductor L, and the second input terminal and the second output terminal are short circuited and represent a ground GND. Finally, a capacitance C is connected in parallel with the output, i.e., between the output terminals.

For service and/or safety reasons, audio systems are often provided with a diagnostic system configured to detect the connection status of the load, i.e., the speaker(s) 30. For example, preferably the diagnostic circuit should be able to detect whether the speaker 30 is damaged, e.g., short circuited or disconnected. For example, a short circuit between the output terminals of the audio amplifier 20 may cause a high current flow, which may overheat and/or damage the audio amplifier 20.

Usually, the diagnostic circuit operates when the signal generator 10 is deactivated. In this case, a given audio test signal with given frequency characteristics is applied to the audio amplifier 20 and the output current $I_{out}$ is monitored in order to determine whether the speaker 30 is connected to the audio amplifier 20. For example, such a diagnostic operation may be performed when the audio system is switched on or during a test cycle.

However, the above solution is unable to detect the detachment of the speaker, while the audio signal generator 10 provides the signal AS to the audio amplifier. In fact, the characteristics of the audio signal, for example music, are usually not stable. Moreover, the impedance of the speaker 30 does not represent a pure resistance but may be modelled with a RLC circuit. Finally, a speaker 30 subject to vibrations (as usual in the automotive field) may even generate a current. For these reasons, a simple monitoring of the output current $I_{out}$ is likely to generate false detections.

SUMMARY

According to one or more embodiments, one or more of the above problems may be avoided through a diagnostic circuit having features as discussed below. Embodiments, moreover, concern a corresponding audio system, integrated circuit and method.

As mentioned in the foregoing, the present disclosure describes solutions for identifying the load status in an audio system.

In various embodiments, a diagnostic circuit is used with is able to detect the load status of the audio amplifier.

In various embodiments, the diagnostic circuit comprises a first circuit configured to generate a signal indicating whether a signal provided via the output terminals of the audio amplifier comprises an audio signal. For example, in various embodiments, the first circuit may determine a signal being indicative for the output voltage provided at the output terminals of the audio amplifier. For example, the first circuit may directly monitor the output voltage. However, the first circuit may also monitor other signals. For example, in various embodiments, the first circuit may monitor a voltage applied to the input terminals of the audio amplifier. In case, the audio amplifier is able to receive directly a digital audio signal at input, the first circuit may also monitor this digital audio signal.

For example, in order to determine whether the output signal of the audio amplifier comprises an audio signal, the first circuit may compare the measurement signal with at least one threshold in order to determine whether the output voltage has a low voltage amplitude profile or a high voltage amplitude profile. Specifically, the output signal of the audio amplifier will comprise an audio signal when the output voltage has a high voltage amplitude profile, i.e., a high average amplitude.

For this purpose, the first circuit may comprise a signal evaluation circuit.

For example, in various embodiments, the signal evaluation circuit elaborates the measurement signal in order to determine a value being indicative of the average amplitude of the output voltage. For example, the circuit may comprise for this purpose a low pass filter or an integrator. Next, the signal evaluation circuit may determine whether the average amplitude of the output voltage is greater than a given threshold and classify the output voltage accordingly, e.g., classify the output voltage as a high output voltage amplitude profile when the value is greater than the threshold.

Instead, in other embodiments, the signal evaluation circuit may elaborate the measurement signal in order to determine whether the amplitude of the output voltage is greater than a given threshold and determine, for a given number of time instances, the number of instances in which the output voltage is greater than this threshold. Accordingly, the number of instances may be compared with a further threshold in order to classify the output voltage as a low or high voltage amplitude profile.

In various embodiments, the diagnostic circuit comprises also a second circuit. Specifically, this second circuit detects a signal being indicative for the output current provided via the output terminals of the audio amplifier. The second circuit moreover compares this measurement signal with at least one threshold in order to generate a second signal indicating whether the output current has a low or high current amplitude profile. Accordingly, the second circuit may be implemented similar to the first circuit.

In various embodiments, the diagnostic circuit comprises also a third circuit configured to generate a diagnostic signal as a function of the first and the second signal. For example, the diagnostic signal may indicate an open load condition when the first signal provided by the first circuit indicates that the output signal comprises an audio signal and the second signal provided by the second circuit indicates a low current amplitude profile. Conversely, the diagnostic signal may indicates a normal load condition when the first signal indicates that the output signal comprises an audio signal and the second signal indicates a high current amplitude profile, i.e., a high current absorption. The diagnostic signal may also indicate that the diagnostic signal does not contain valid information, e.g., when the first signal indicates that the output signal does not comprise an audio signal.

BRIEF DESCRIPTION OF THE DRAWINGS

Embodiments of the present disclosure will now be described with reference to the annexed drawings, which are provided purely by way of non-limiting example and in which.

DETAILED DESCRIPTION OF ILLUSTRATIVE EMBODIMENTS

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

In the following FIGS. 4 to 15 parts, elements or components which have already been described with reference to FIGS. 1 to 3 are denoted by the same references previously used in such figures. The description of such previously described elements will not be repeated in the following in order not to overburden the present detailed description.

As mentioned in the foregoing, the present disclosure provides solutions for detecting the status of the output load in an audio system.

Specifically, in various embodiments, the system is able to determine the status of the load while the signal generator 10 provides a casual analog audio signal AS or digital audio signal DS.

Figure 4:
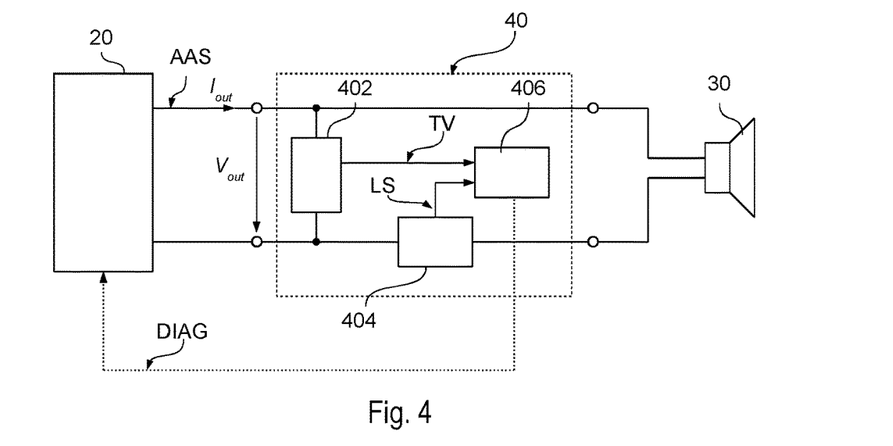
FIG. 4 shows a first embodiment of an audio system in accordance with the present disclosure.

FIG. 4 shows a first embodiment of an audio system in accordance with the present disclosure.

Specifically, in the embodiment considered, the system comprises an audio amplifier 20 providing an amplified analog audio signal AAS to be sent to at least one speaker 30. Reference can thus be made to FIGS. 1 to 3 for a possible implementation of these components of the audio system in the context of a class D audio amplifier. However, also other audio amplifiers may be used, such as class A/B audio amplifiers. Generally, the audio amplifier 20 will thus provide an output voltage $V_{out}$ and an output current $I_{out}$ which depend on the impedance of the load, e.g., the speaker(s) 30.

In the embodiment considered, the system comprises moreover a diagnostic circuit 40.

Specifically, in the embodiment considered, the diagnostic circuit 40 comprises a first circuit 402 configured to determine a signal TV indicating whether the amplified signal AAS contains an audio signal. For example, in the embodiments considered, this is obtained by monitoring and analyzing the output voltage $V_{out}$.

In the embodiment considered, the diagnostic circuit 40 comprises also a second circuit 404 configured to determine a signal LS indicating the status of the load. For example, in the embodiments considered, this is obtained by monitoring and analyzing the output current $I_{out}$.

In the embodiment considered, the signals TV and LS are provided to a processing circuit 406, which determines a signal DIAG indicating the diagnostic status of the audio system as a function of the signals TV and LS. For example, this signal DIAG may be provided to the amplifier 20, e.g., in order to switch off the amplifier in case of abnormal load conditions.

Figure 5A:
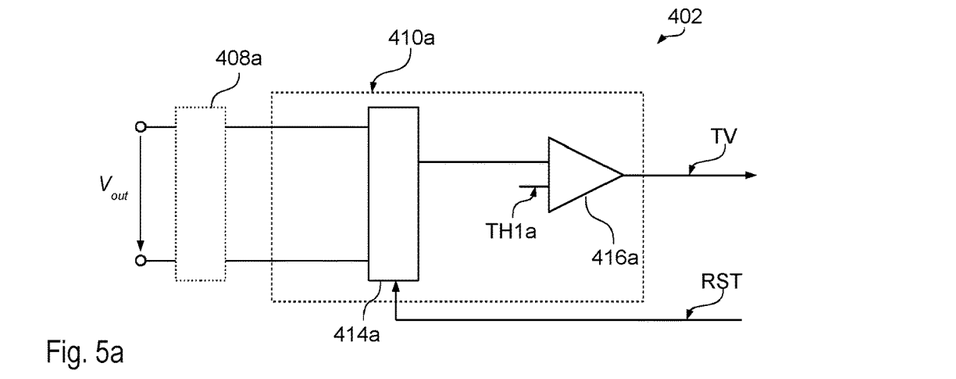
FIGS. 5a-5b to 11 and 15 show details of the audio system of FIG. 4.

For example, FIG. 5a shows a first embodiment of the circuit 402 configured to determine the signal TV indicating whether the amplified signal AAS contains an audio signal.

Specifically, in various embodiments, the circuit 402 comprises a signal evaluation circuit 410a configured to analyze the amplitude of the voltage $V_{out}$ in order to determine whether the signal AAS contains audio information or mere noise.

Figure 6A:
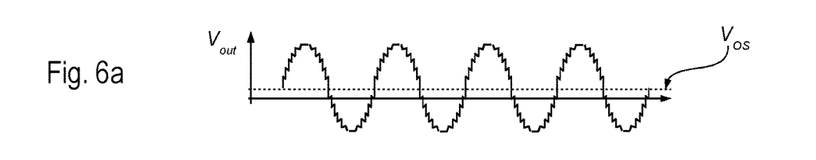

For example, a possible waveform of the voltage $V_{out}$ is shown in FIG. 6a, wherein the output voltage $V_{out}$ comprises some kind of disturbance and a DC offset $V_{OS}$.

Accordingly, in various embodiments, the circuit 402 may comprise an analog or digital signal processing stage 408a configured to elaborate the voltage signal $V_{out}$.

For example, in various embodiments, the signal processing stage 408a may comprise a voltage divider or generally an amplifier stage in order to scale the amplitude of the voltage $V_{out}$.

Moreover, the signal processing stage 408a may comprise a filter. For example, in various embodiments, a band-pass filter may be used, which is able to remove the DC offset and the high frequency disturbance. For example, in various embodiments, the filter may be configured to let pass frequencies between 20 Hz and 20 kHz.

Generally, the band-pass filter may also be more selective. For example, in so called multi-way speaker systems, the same audio signal AAC may be provided to various speakers, such as woofer, midrange and tweet, having associated respective filters. Accordingly, the circuit 408a may also comprise a plurality of selectable band-pass filters in order to evaluate the behavior of each of these speakers.

Figure 6B:
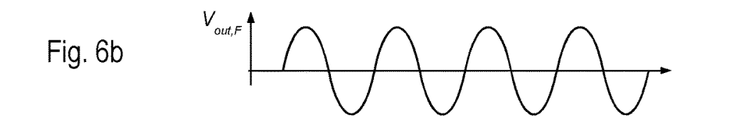

For example, a possible waveform of the filtered signal $V_{out,F}$ at the output of the signal processing stage 408a is shown FIG. 6b.

Figure 6C:
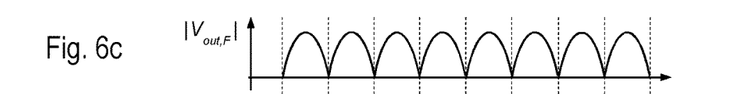

In various embodiments, the signal processing stage 408a may comprise a rectifier circuit, such as a single diode or a bridge rectifier, configured to rectify the voltage signal $V_{out}$ or the filtered signal $V_{out,F}$. For example, a possible waveform of a rectified an filtered signal $|V_{out,F}|$ at the output of the signal processing stage 408a is shown FIG. 6c.

Generally, the signal evaluation circuit 410a may be any suitable analog and/or digital circuit, such as a dedicated integrated circuit or a software programmed micro-processor. Accordingly, the signal processing stage 408a may also comprise an analog-to-digital converter, and also part of the signal processing, such as the band-pass filter may be implemented digitally.

The inventors have observed that a mere punctual evaluation of the voltage level is insufficient in order to reliably determine whether the signal AAS contains valid audio information.

According, in various embodiments, the signal evaluation circuit 410a is configured to evaluate the amplitude of the voltage signal $V_{out}$ or preferably the processed signal $V_{out,F}$ or $|V_{out,F}|$ over plural time instances. Specifically, in various embodiments, the signal evaluation circuit 410a is configured to analyze the evolution of the amplitude of the voltage $V_{out}$ in order to determine whether the signal AAS contains an audio signal, e.g., a signal with a high average amplitude, or noise, e.g., a signal with a low average amplitude.

Accordingly, generally, the signal TV at the output of the signal evaluation circuit 410a is set to:
  a first logic level, such as high, when the signal AAS contains an audio signal, e.g., when the rectified voltage $|V_{out,F}|$ has a value which in average exceeds a given threshold, or
  a second logic level, such as low, when the signal AAS contains only noise, e.g., when the rectified voltage $|V_{out,F}|$ has a value which in average is below a given threshold.

For example, FIG. 5a shows a first embodiment, in which the rectified signal is $|V_{out,F}|$ at the output of the signal processing stage 408a is provided to an analog or digital filter 414a.

For example, the filter 414a may be a low pass filter, such as a RC filter, configured to determine the mean amplitude of the rectified voltage signal $|V_{out,F}|$.

The filter 414a may also be an integrator, which generates a signal $V_{int}$ by integrating the rectified voltage signal $|V_{out,F}|$ over a given time interval. Those of skill in the art will appreciate that (for a given and preferably fixed duration of the integration period) the signal $V_{int}$ is proportional to the average amplitude of the rectified voltage signal $|V_{out,F}|$.

Figure 6D:
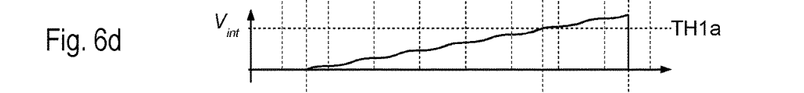
Figure 6E:
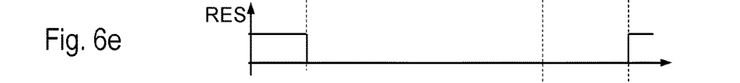

For example, as shown in FIG. 6e, the signal evaluation circuit 410a may integrate (see FIG. 6d) the rectified voltage signal $|V_{out,F}|$, when a reset signal RES is low (see FIG. 6e), and the integration may be reset when the reset signal RES is high. Those of skill in the art will appreciate that a substantially similar behavior may be obtained by inverting the logic levels of the signal, e.g., by using an enable signal instead of a reset signal.

Figure 6F:
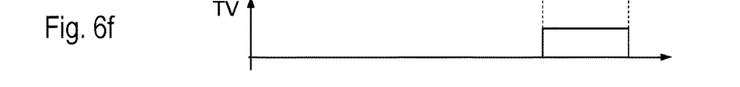
Figure 6G:
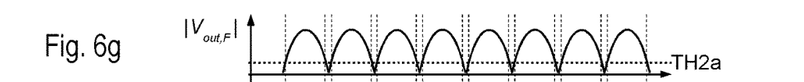
Figure 6H:
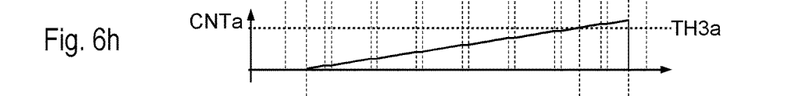

Accordingly, in the embodiment considered, the signal at the output of the filter 414a, e.g., a signal being indicative for the average amplitude of the voltage signal $V_{out}$, may be provided to a comparator 416a in order determine the signal TV by comparing the average value of the signal $|V_{out,F}|$ or the integral of the signal $|V_{out,F}|$ with a predetermined threshold TH1a. For example, the signal TV may be set to high when the average value of the signal $|V_{out,F}|$ or the integral of the signal $|V_{out,F}|$ is greater than the threshold TH1a (see FIG. 6f).

FIGS. 7a to 7f show in this respect possible waveforms of the corresponding signals shown in FIGS. 6a to 6f, wherein the amplitude of the voltage $V_{out}$ is small, and accordingly the signal TV remains low, because the signal at the output of the circuit 414a remains below the threshold TH1a.

Figure 5B:
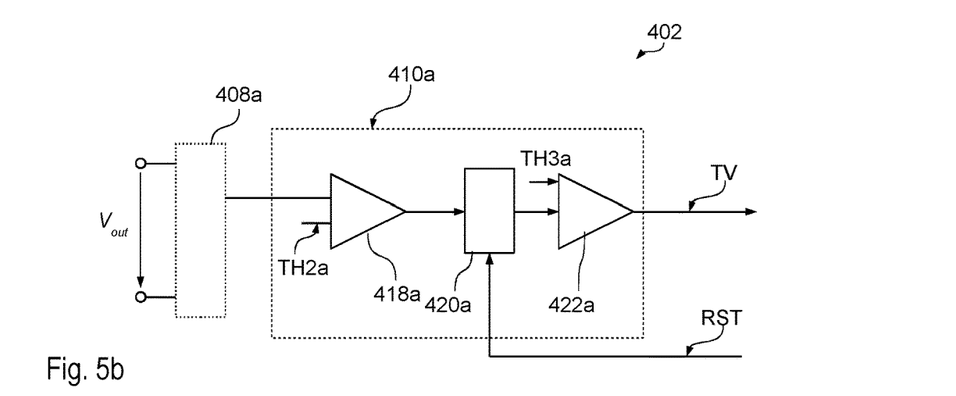

FIG. 5b shows instead an embodiment, which permits a rather low complexity digital implementation.

In the embodiment considered, the rectified voltage signal $|V_{out,F}|$ is directly provided to a comparator 418a which determines whether the amplitude of the rectified voltage signal $|V_{out,F}|$ is greater than a predetermined threshold TH2a, which preferably is higher than the amplitude of a typically background noise.

Accordingly, in the embodiment considered, the output of the comparator 418a is set e.g., to high when the amplitude of the rectified voltage signal $|V_{out,F}|$ is greater than the threshold TH2a, i.e., when the rectified voltage signal $|V_{out,F}|$ has a level exceeding the level of typical noise.

Generally, the circuit could also operate without a rectified voltage. In fact, in this case, the comparator 418a would only operate with the positive half-waves of the signal. Moreover, also two comparators could be used, wherein the second comparator operates with a corresponding negative threshold value.

In the embodiment considered, the comparison signal at the output of the comparator 418a is provided to a counter 420a, which determines a count value CNTa which indicates (for a given and preferably fixed time interval) the number of instances in which the comparison signal indicated that the rectified voltage signal $|V_{out,F}|$ has a level exceeding the level of typical noise.

Figure 6I:
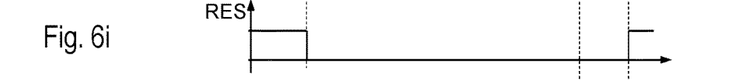
Figure 6J:
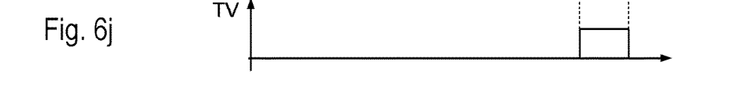
Figure 7A:
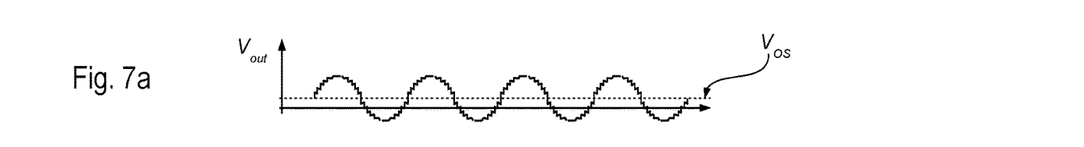
Figure 7B:
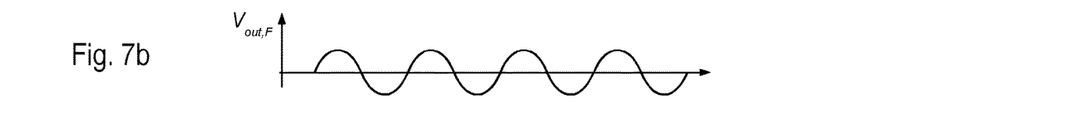
Figure 7C:
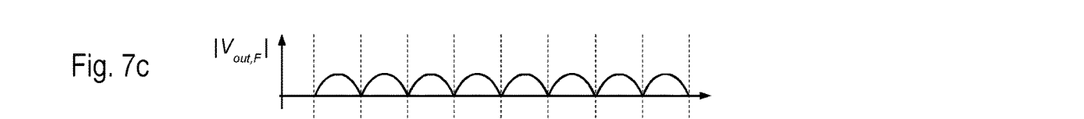
Figure 7D:
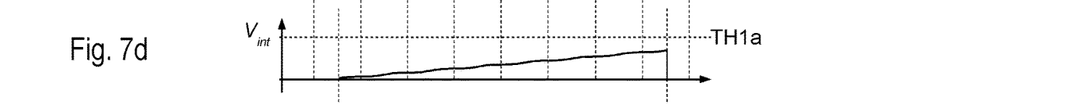
Figure 7E:
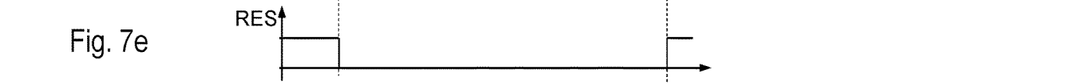
Figure 7F:
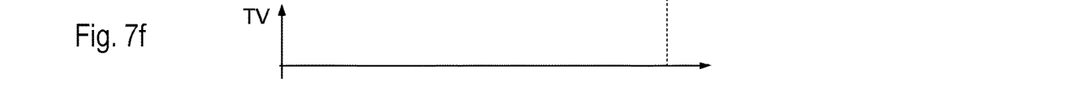
Figure 7G:
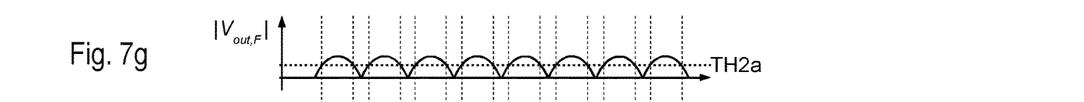
Figure 7H:
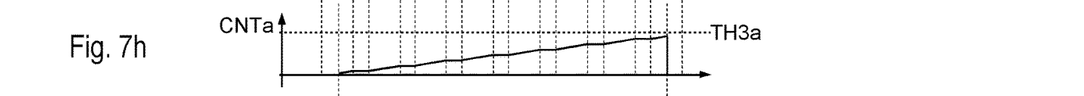
Figure 7I:
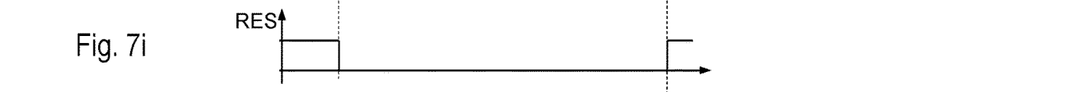
Figure 7J:
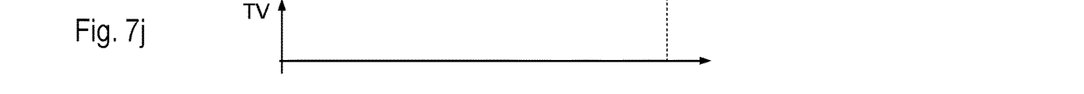

For example, as shown in FIG. 6i, again the previously described reset signal RES may be used for this purpose, e.g.:
- the count value CNTa of the counter 420a may be incremented e.g., when the reset signal RES is low and the comparison signal is high, i.e., when the counter 420a is enabled and the amplitude of the rectified voltage signal $|V_{out,F}|$ is high;
- the count value CNTa of the counter 420a remains unchanged e.g., when the reset signal RES is low and the comparison signal is low, i.e., when the counter 420a is enabled and the amplitude of the rectified voltage signal $|V_{out,F}|$ is low; and
- the count value CNTa of the counter 420a may be reset e.g., when the reset signal RES is high, i.e., when the counter 420a is disabled.

Finally, the count value CNTa may be provided to a further comparator 422a, which determines whether the count value CNTa is greater than a predetermined threshold TH3a. Accordingly, in the embodiment considered, the signal TV is set to high, when the amplitude of the rectified voltage signal $|V_{out,F}|$ exceeds the level of noise for a given number of times.

FIGS. 7g to 7j show in this respect possible waveforms of the corresponding signals shown in FIGS. 6g to 6j, wherein the amplitude of the voltage $V_{out}$ is small, and accordingly the signal TV remains low, because the count value CNTa does not reach the threshold TH3a.

Generally, the above solutions have in common that the circuit 402 monitors the voltage $V_{out}$ in order to determine a signal TV which indicates whether the signal AAS at the output of the amplifier 20 contains either an audio signal or noise.

The circuits shown in FIGS. 5a and 5b may also be used for the current monitoring circuit 404.

Figure 8:
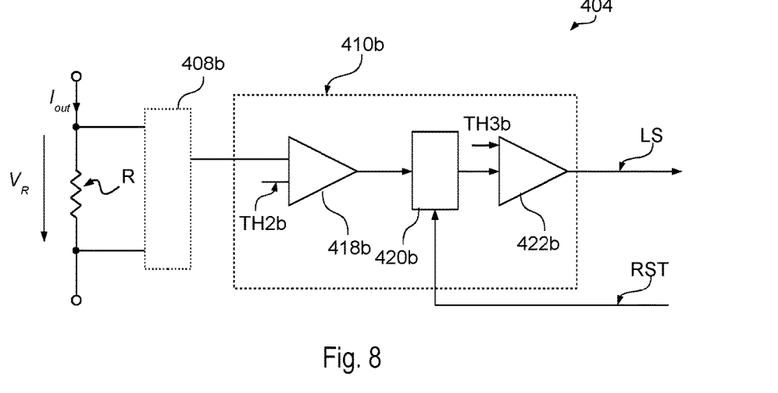
Figure 9A:
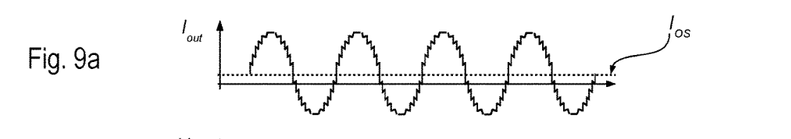
Figure 9B:
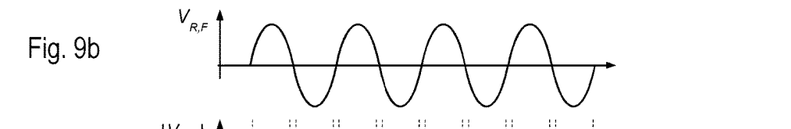
Figures 9C, 9D, 9E:
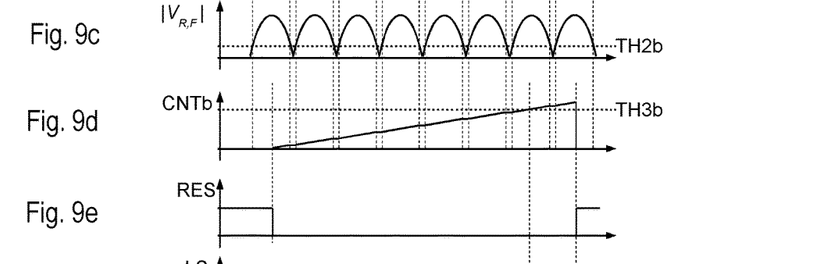
Figure 9F:
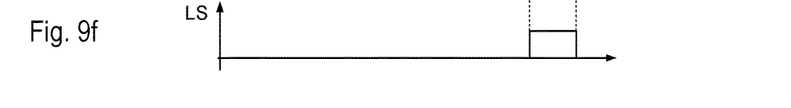
Figure 10A:
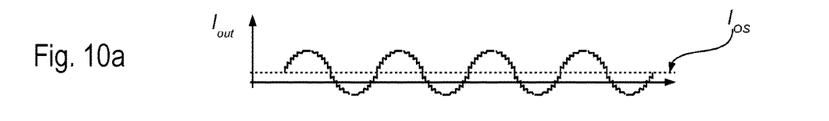
Figure 10B:
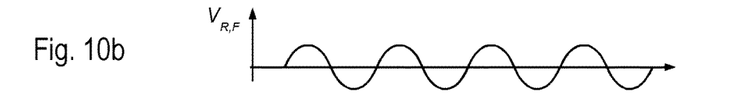
Figure 10C:
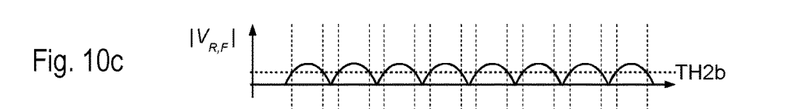
Figure 10D:
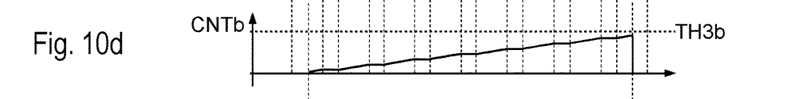
Figure 10E:
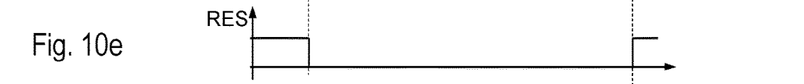
Figure 10F:
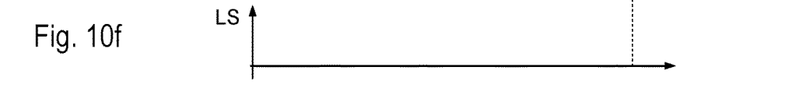

For example, FIG. 8 shows a possible embodiment of the circuit 404.

In the embodiment considered, the circuit 404 comprises a current sensor configured to monitor the current $I_{out}$, i.e., the current flowing through the speaker(s) 30, such as a resistor R connected in series with the speaker(s) 30. Accordingly, in the embodiment considered the voltage $V_R$ at the resistor R is indicative for the current $I_{out}$. Generally, also other resistances connected in series with the load may be used as sensors, such as e.g., the switch-on resistance of one of the switches of the amplifier stage 206 shown in FIG. 2. Moreover, also other types of current sensors may be used which provide a signal being indicative for the current provided to the load, such as a Hall sensor.

Accordingly, the previously described signal processing circuits and signal evaluation circuits may also be used for the analysis of the voltage $V_R$ in order to determine a signal LS which indicates whether the current flowing through the load is within predetermined limits.

For example, in the embodiments considered, the solution shown in FIG. 5b is used.

Specifically, also in this case, a signal processing circuit 408b may be used to determine (e.g., via a band-pass filter) a filtered signal $V_{R,F}$ and preferably a rectified and filtered signal $|V_{R,F}|$ as a function of the voltage $V_R$.

In the embodiment considered, the rectified voltage signal $|V_{R,F}|$ is then provided to at least one comparator 418b which determines whether the amplitude of the rectified voltage signal $|V_{R,F}|$ is greater than a predetermined threshold TH2b, which usually should be higher than the amplitude of a typically open load condition.

Accordingly, in the embodiment considered, the output of the comparator 418b is set e.g., to high when the amplitude of the rectified voltage signal $|V_{R,F}|$ is greater than the threshold TH2b, i.e., when the rectified voltage signal $|V_{R,F}|$ indicates that the output load absorbs a current level exceeding the level of an open load condition.

In the embodiment considered, the comparison signal at the output of the comparator 418b is provided to a counter 420b, which determines a count value CNTb which indicates (again for a given time interval) the number of instances in which the comparison signal indicates that the output load absorbs a current level exceeding the level of an open load condition.

The count value CNTb may then be provided to a further comparator 422b, which determines whether the count value CNTb is greater than a predetermined threshold TH3b. Accordingly, in the embodiment considered, the signal LS is set to high, when the output load absorbs a current level exceeding the level of an open load condition for a given number of times.

FIGS. 9a to 9f and 10a to 10f show in this respect possible waveforms of the above mentioned signals for a typical current absorption (FIG. 9) and an unduly low current absorption (FIG. 10), respectively.

As mentioned in the foregoing, the signal TV indicating whether the signal AAS contains an audio signal, and the signal LS indicating whether the current absorption is normal are provided to the processing circuit 406.

Substantially, in various embodiments, the processing circuit 406 considers the signal TV as a signal indicating whether the test is valid, because the signal LS may only indicate a normal current absorption profile, when also the signal TV indicates that the signal AAC contains an audio signal.

Figure 15:
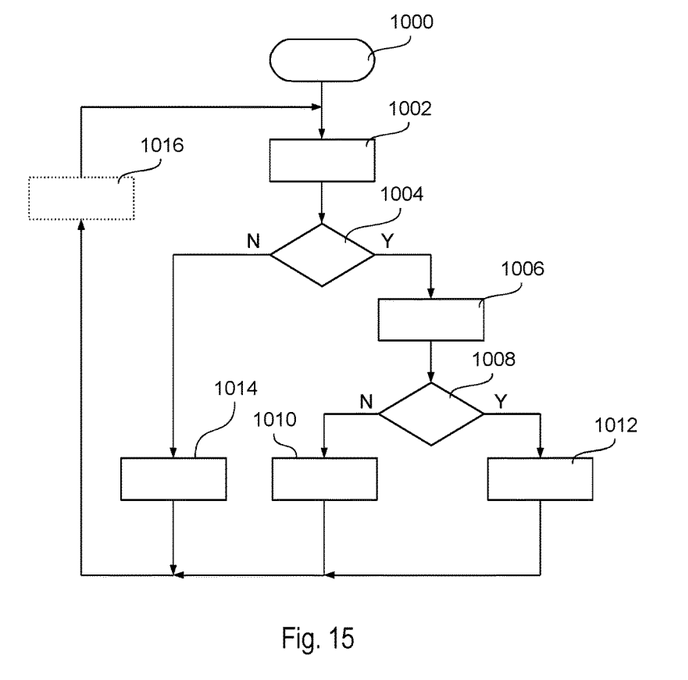

For example, FIG. 15 shows a possible embodiment of the operation of the processing circuit 406.

After a start step 1000, the circuit 406 determines at a step 1002 the value of the signal TV, which as described in the foregoing may indicate e.g., a low output voltage (typical for noise) or a high output voltage (typical for an audio signal).

Accordingly, at a step 1004, the circuit 406 may test whether the signal TV indicates that the signal AAC contains an audio signal.

In case the signal AAC contains an audio signal (output Y of the step 1004), the circuit 406 may determine at a step 1006 the value of the signal LS, which as described in the foregoing may indicate e.g., a low output current (typical for an open load) or a high output current (typical when the speaker is connected).

At a step 1008, the circuit 406 may then test whether the signal LS indicates that the speaker is connected, e.g., the current absorption profile is normal.

In case the current absorption profile is normal, (output Y of the step 1008), the circuit 406 may set at a step 1012 the signal DIAG to a value indicating that the audio system is operating normally.

In case the speaker is disconnected and an open load condition is determined (output N of the step 1008), the circuit 406 may set at a step 1010 the signal DIAG to a value indicating that the speaker is disconnected.

In case the signal AAC does not contain an audio signal (output N of the step 1004), the circuit 406 may set at a step 1014 the signal DIAG to a value indicating that the test is not valid.

In all cases (steps 1010, 1012 and 1014) the circuit 406 may return to the step 1002 for performing a new test. Preferably, in this case may be used a wait step 1016, in which the circuit 406 waits a predetermined amount of time or till a new test is requested.

Accordingly, in the embodiment considered, the circuit 406 disregards the result of the current test performed by the circuit 404, when the output voltage detected by the circuit 402 is too low.

Figure 11:
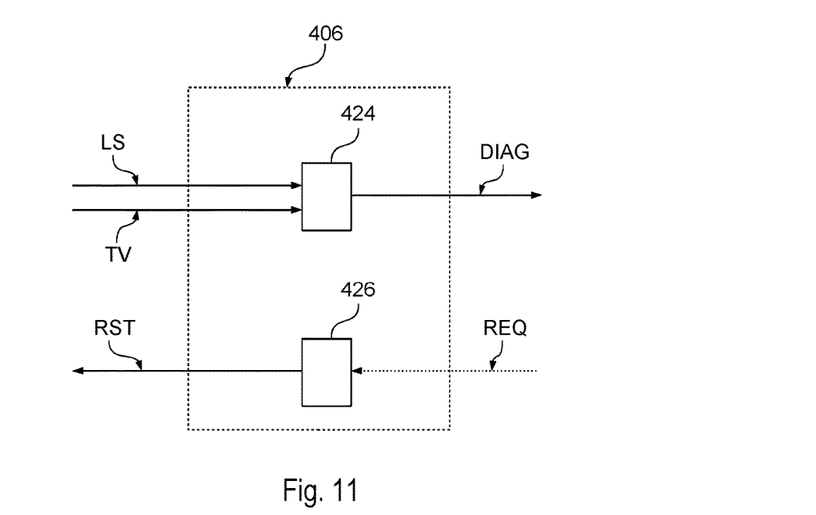

FIG. 11 shows a possible embodiment of the circuit 406.

In the embodiment considered, the circuit 406 comprises a control circuit 426 configured to generate the reset signal RST (or a corresponding enable signal) used to activate the circuits 402 and 404. For example, the reset signal may be generate periodically or as a function of a request signal REQ provided by a further circuit, such as the audio amplifier 20.

In the embodiment considered, the circuit 406 comprises a further circuit 424 configured to determine the diagnostic signal DIAG as a function of the values of the signals TV and LS.

For example, the circuit 424 may be implemented with a latch or flip-flop, such as a D flip-flop, which stores the value of the signal LS only when the signal TV is high.

However, this solution does not take into the signal amplitudes. Specifically, in case the signal AAS contains a strong audio signal and the average amplitude of the output voltage $V_{out}$ is high, also the integrated output voltage $I_{out}$ should reach the respective threshold in comparable (short) time interval. Conversely, when the signal AAS contains a weak audio signal and the average amplitude of the output voltage $V_{out}$ is lower, also the integrated current signal may only reach the respective threshold after a longer period of time.

Accordingly, in a currently preferred embodiments, the signal LS is sampled when the logic value of the signal TV changes, e.g., when the signal TV changes from low to high.

For example, this may be achieved by using the signal TV as clock signal for sampling the signal LS, i.e., the signal LS is only sampled at the raising edge of the signal TV. A similar behavior may be obtained by generating in a synchronous manner an enable signal (e.g., for a D flip-flop) which contains a short pulse when the circuit 424 detects that the signal TV has changed the logic level, e.g., from low to high. Accordingly, in this case the signal LS is sampled when the signal TV indicates that the threshold TH1*a* or TH3*a* has been reached. Accordingly, the sampling instant changes based on the amplitude profile of the voltage $V_{out}$, i.e., the signal LS will be sampled earlier for high audio signal levels and later for small audio signal levels.

Thus, generally, the duration in which the reset signal is low corresponds to a time-out period:
 in case the signal TV does not change the logic level, e.g., goes to high, the test is invalid;
 in case the signal TV changes the logic level, e.g., goes to high, the test is valid and the signal LS may be sampled.

Generally, the circuit 426 could also generate a separate signal used to define a time-out period, and the reset signal could be used to reset the circuits 402 and/or 404, such as the integrator 414*a* shown in FIG. 5*a* or the counter 420*a* shown in FIG. 5*b*.

Accordingly, in the embodiment considered, the step 1016 of FIG. 15 may be performed by the control circuit 426 and the remaining steps used to determine the signal DIAG may be performed by the circuit 424.

Generally, the circuit 402 configured to determine whether the signal AAS contains an audio signal may also be integrated in the signal generator 10.

Figure 12:
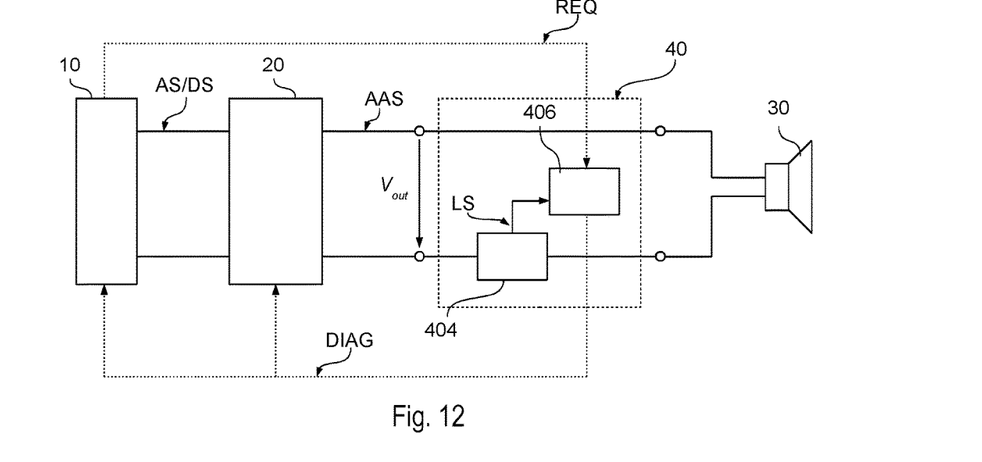
FIG. 12 shows a second embodiment of an audio system in accordance with the present disclosure.

For example, as shown in FIG. 12, the signal generator 10 usually provides an analog audio signal AS or a digital audio signal DS to the audio amplifier 20.

Accordingly, in this case the signal generator 10 already knows when an audio signal is sent to the audio amplifier 20 and the signal generator 10 may request the execution of a monitoring cycle of the output current (by means of a signal REQ provided to the control circuit 406) only in case these signals AS/DS contain audio information.

Figure 13:
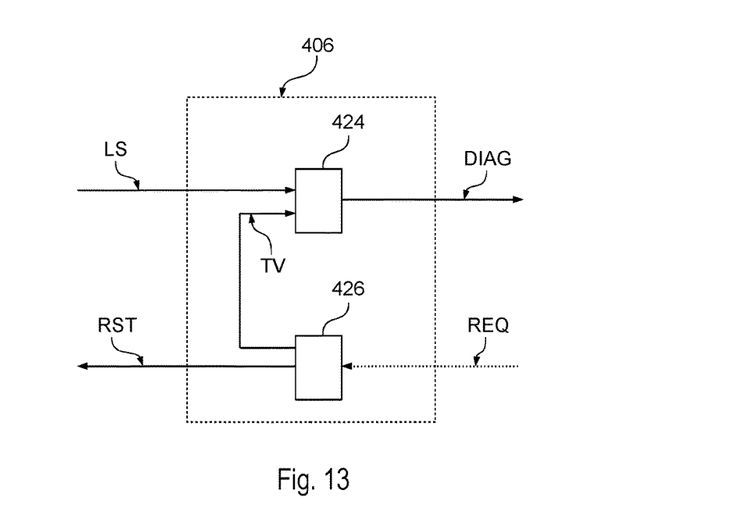
FIG. 13 show details of the audio system of FIG. 12.

Specifically, as shown in FIG. 13, in this case, the circuit 426 could generate internally the signal TV as a function of the request signal REQ.

Figure 14:
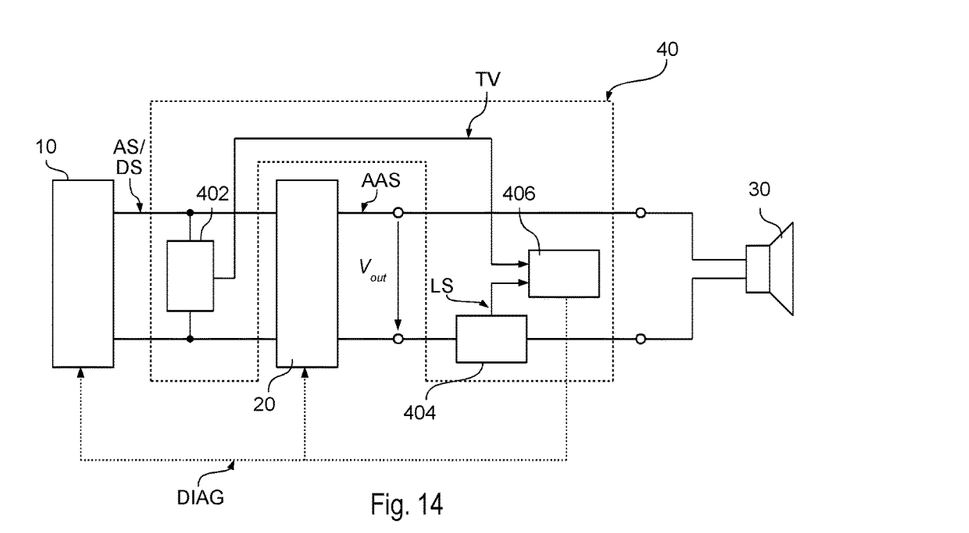
FIG. 14 shows a third embodiment of an audio system in accordance with the present disclosure.

Finally, FIG. 14 shows an embodiment, in which the circuit 402 is used to monitor the signal at the input of the audio amplifier 20, e.g., the analog audio signal AS or the digital audio signal DS.

This embodiment, is particularly useful in case of a digital audio signal DS, because in this case is already available a digital value being proportional to the expected output voltage amplitude, thereby reducing the complexity of the circuit 408*a*, which e.g., may not require an analog-to-digital converter.

Generally, the diagnostic circuit 40 shown in FIGS. 4 and 14 may also be integrated in the audio amplifier 20. An audio system that includes the diagnostic circuit 40 and the audio amplifier 20 can be integrated in a single integrated circuit chip.

Moreover, the diagnostic signal DIAG may be provided to the signal generator 10 and/or the audio amplifier 20.

For example, the signal generator 10 such as a radio or a MP3 player usually has associated a display device. Accordingly such a display device could be used to show an error message to the user, e.g., in case an open load or a short-circuit condition is determined.

Of course, without prejudice to the principle of the invention, the details of construction and the embodiments may vary widely with respect to what has been described and illustrated herein purely by way of example, without thereby departing from the scope of the present invention, as defined by the ensuing claims.

What is claimed is:

1. A method for detecting a load status of an audio amplifier that comprises two output terminals for connection to a speaker, the method comprising:
 detecting a first measurement signal that is indicative of an output current that is provided via the two output terminals;
 determining a second measurement signal that is indicative of an output voltage that is provided via the two output terminals:
 processing the second measurement signal to determine a first average value that is indicative of an average amplitude of the output voltage;
 determining whether a signal provided via the two output terminals comprises an audio signal by
  comparing the first average value with a first threshold, and
  generating a first signal that indicates that the output voltage has a low voltage amplitude profile when the first average value is lower than the first threshold, or a high voltage amplitude profile when the first average value is higher than the first threshold;

comparing the first measurement signal with a second threshold in order to generate a second signal that indicates that the output current has a low current amplitude profile when the first measurement signal is lower than the second threshold or a high current amplitude profile when the first measurement signal is higher than the second threshold; and generating a diagnostic signal as a function of the first signal and the second signal, wherein the diagnostic signal indicates an open load condition when the first signal indicates that the signal provided via the two output terminals comprises the audio signal and the second signal indicates a low current amplitude profile.

2. The method according to claim 1, wherein the diagnostic signal indicates a normal load condition when the first measurement signal indicates that the signal provided via the two output terminals comprises the audio signal and the second signal indicates the high current amplitude profile.

3. The method according to claim 2, wherein the diagnostic signal indicates that the diagnostic signal does not contain valid information when the first measurement signal indicates that the signal provided via the two output terminals does not comprises the audio signal.

4. The method according to claim 1, wherein determining the second measurement signal comprises monitoring the output voltage provided via the two output terminals.

5. The method according to claim 1,
wherein the signal provided via the two output terminals comprises the audio signal when the output voltage has a high voltage amplitude profile.

6. The method according to claim 1,
wherein generating the second signal comprises determining for a plurality of time instances a number of instances in which the first measurement signal is greater than the second threshold, and
classifying the output voltage or the output current as:
  a) a low current amplitude profile when the number of instances in which the output current is greater than the second threshold is smaller than a third threshold; and
  b) a high current amplitude profile when the number of instances in which the output current is greater than the second threshold is greater than the third threshold.

7. The method according to claim 1, further comprising sampling the second signal when the first signal changes from a first state to a second state.

8. The method according to claim 1, wherein processing the second measurement signal comprises rectifying the second measurement signal.

9. A diagnostic circuit for detecting a load status of an audio amplifier, the audio amplifier comprising two output terminals for connection to a speaker, the diagnostic circuit comprising:
a first circuit configured to generate a first signal indicating whether a signal provided via the two output terminals comprises an audio signal;
a second circuit configured to detect a first measurement signal that is indicative of an output current provided via the two output terminals, and to compare the first measurement signal with a threshold in order to generate a second signal that indicates whether the output current has a low current amplitude profile or a high current amplitude profile;
a third circuit configured to generate a diagnostic signal as a function of the first signal and the second signal, wherein the diagnostic signal indicates an open load condition when the first signal indicates that the signal provided via the two output terminals comprises an audio signal and the second signal indicates a low current amplitude profile; and a signal evaluation circuit configured to:
process the first measurement signal in order to determine a value that indicates an average amplitude of the output current;
determine whether the value that indicates the average amplitude of the output current is greater than a first threshold; and
classify the output current as:
  a) a low current amplitude profile when the value being indicative for the average amplitude of the output current is smaller than the first threshold; and
  b) a high current amplitude profile when the value being indicative for the average amplitude of the output current is greater than the first threshold.

10. The diagnostic circuit according to claim 9, wherein the diagnostic signal indicates a normal load condition when the first signal indicates that the signal provided via the two output terminals comprises an audio signal and the second signal indicates a high current amplitude profile.

11. The diagnostic circuit according to claim 10, wherein the diagnostic signal indicates that the diagnostic signal does not contain valid information when the first signal indicates that the signal provided via the two output terminals does not comprise an audio signal.

12. The diagnostic circuit according to claim 9, wherein the first circuit is configured to determine a second measurement signal that is indicative of an output voltage provided via the two output terminals.

13. The diagnostic circuit according to claim 12, wherein the first circuit is configured to determine the second measurement signal by monitoring the output voltage provided via the two output terminals.

14. The diagnostic circuit according to claim 12, wherein the audio amplifier comprises two input terminals for receiving an analog audio signal and the first circuit is configured to determine the second measurement signal by monitoring a voltage applied to the two input terminals.

15. The diagnostic circuit according to claim 12, wherein the audio amplifier comprises two input terminals for receiving a digital audio signal and wherein the first circuit is configured to determine the second measurement signal by monitoring the digital audio signal.

16. The diagnostic circuit according to claim 12, wherein the first circuit is configured to:
compare the second measurement signal with at least one threshold in order to determine whether the output voltage has a low voltage amplitude profile or a high voltage amplitude profile; and
set the first signal to indicate that the signal provided via the two output terminals comprises an audio signal when the output voltage has a high voltage amplitude profile.

17. The diagnostic circuit according to claim 9, wherein the signal evaluation circuit comprises:
a first comparator having a first input configured to receive the first measurement signal, a second input configured to receive the first threshold;
a counter having an input coupled to an output of the first comparator; and
a second comparator having a first input coupled to a second threshold, a second input coupled to an output of the second comparator, and an output configured to generate the second signal.

18. The diagnostic circuit according to claim 9, wherein the third circuit is configured to generate, periodically or in response to a request signal, a reset signal to activate the first circuit and the second circuit.

19. An audio system comprising:
a diagnostic circuit according to claim 9;
wherein the diagnostic circuit and the audio amplifier are integrated in a single integrated circuit chip.

20. A diagnostic circuit for detecting a load status of an audio amplifier, the audio amplifier comprising two output terminals for connection to a speaker, the diagnostic circuit comprising:
a first circuit configured to generate a first signal indicating whether a signal provided via the two output terminals comprises an audio signal;
a second circuit configured to detect a first measurement signal that is indicative for an output current provided via the two output terminals, and to compare the first measurement signal with a threshold in order to generate a second signal that indicates whether the output current has a low current amplitude profile or a high current amplitude profile;
a third circuit configured to generate a diagnostic signal as a function of the first signal and the second signal, wherein the diagnostic signal indicates an open load condition when the first signal indicates that the signal provided via the two output terminals comprises an audio signal and the second signal indicates a low current amplitude profile; and
a signal evaluation circuit configured to:
process the first measurement signal to determine whether an amplitude of the output current is greater than a second threshold,
determine for a given number of time instances a number of instances in which the output current is greater than the second threshold, and
classify the output current as:
a) a low current amplitude profile when the number of instances in which the output current is greater than the second threshold is smaller than a third threshold; and
b) a high current amplitude profile when the number of instances in which the output current is greater than the second threshold is greater than the third threshold.

21. A diagnostic circuit for detecting a load status of an audio amplifier, the audio amplifier comprising two output terminals for connection to a speaker, the diagnostic circuit comprising:
a first circuit configured to generate a first signal indicating whether a signal provided via the two output terminals comprises an audio signal and to determine a second measurement signal that is indicative of an output voltage provided via the two output terminals;
a second circuit configured to detect a first measurement signal that is indicative for an output current provided via the two output terminals, and to compare the first measurement signal with a threshold in order to generate a second signal that indicates whether the output current has a low current amplitude profile or a high current amplitude profile;
a third circuit configured to generate a diagnostic signal as a function of the first signal and the second signal; and
a signal evaluation circuit, wherein:
the diagnostic signal indicates an open load condition when the first signal indicates that the signal provided via the two output terminals comprises an audio signal and the second signal indicates a low current amplitude profile;
the diagnostic signal indicates a normal load condition when the first signal indicates that the signal provided via the two output terminals comprises an audio signal and the second signal indicates a high current amplitude profile;
the diagnostic signal indicates that the diagnostic signal does not contain valid information when the first signal indicates that the signal provided via the two output terminals does not comprise an audio signal; and
the signal evaluation circuit is configured to:
process the first measurement signal and the second signal in order to determine a value that is indicative of an average amplitude of the output current;
determine whether the value indicative of the average amplitude of the output current is greater than a first threshold; and
classify the output current as:
a) a low current amplitude profile when the value being indicative for the average amplitude of the output current is smaller than the first threshold; and
b) a high current amplitude profile when the value being indicative for the average amplitude of the output current is greater than the first threshold.

22. The diagnostic circuit according to claim 21, wherein the signal evaluation circuit is further configured to
determine for a given number of time instances a number of instances in which the output current is greater than the first threshold, and classify the output current as:
a) a low current amplitude profile when the number of instances in which the output current is greater than the first threshold is smaller than a third threshold; and
b) a high current amplitude profile when the number of instances in which the output current is greater than the first threshold is greater than the third threshold.

* * * * *

UNITED STATES PATENT AND TRADEMARK OFFICE
CERTIFICATE OF CORRECTION

PATENT NO. : 10,104,483 B2
APPLICATION NO. : 15/216579
DATED : October 16, 2018
INVENTOR(S) : Edoardo Botti et al.

Page 1 of 1

It is certified that error appears in the above-identified patent and that said Letters Patent is hereby corrected as shown below:

In the Claims

In Column 10, Line 55, Claim 1, delete "output terminals:" and insert --output terminals;--.

Signed and Sealed this
Eleventh Day of December, 2018

Andrei Iancu
*Director of the United States Patent and Trademark Office*